US008304853B2

(12) United States Patent
Kim

(10) Patent No.: US 8,304,853 B2
(45) Date of Patent: Nov. 6, 2012

(54) FUSE LAYOUT STRUCTURE OF SEMICONDUCTOR DEVICE

(75) Inventor: Yong-Ho Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 410 days.

(21) Appl. No.: 12/631,467

(22) Filed: Dec. 4, 2009

(65) Prior Publication Data

US 2010/0308953 A1 Dec. 9, 2010

(30) Foreign Application Priority Data

Jun. 3, 2009 (KR) ........................ 10-2009-0049075

(51) Int. Cl.
*H01H 85/00* (2006.01)
(52) U.S. Cl. ................. 257/529; 337/297; 257/E23.141
(58) Field of Classification Search .................. 257/529, 257/E23.149; 337/297
See application file for complete search history.

(56) References Cited

U.S. PATENT DOCUMENTS

2007/0023861 A1* 2/2007 Yang ............................. 257/529

FOREIGN PATENT DOCUMENTS

| JP | 2006-324306 | 11/2006 |
| KR | 1020030054904 | 7/2003 |
| KR | 1020060001197 | 1/2006 |

OTHER PUBLICATIONS

Notice of Allowance issued from Korean Intellectual Property Office on May 31, 2011.

* cited by examiner

*Primary Examiner* — Roy Potter
(74) *Attorney, Agent, or Firm* — IP & T Group LLP

(57) ABSTRACT

A fuse layout structure of a semiconductor device includes a plurality of fuses in a fuse open area, wherein three neighboring fuses of the plurality of fuses form a fuse unit, and at least one of the fuses partially overlaps at least one of the other fuses of the same fuse unit in the fuse open area.

9 Claims, 6 Drawing Sheets

FUSE LAYOUT STRUCTURE OF SEMICONDUCTOR DEVICE

CROSS-REFERENCE TO RELATED APPLICATION

The present application claims priority of Korean Patent Application No. 10-2009-0049075, filed on Jun. 3, 2009, which is incorporated herein by reference in its entirety.

BACKGROUND OF THE INVENTION

Exemplary embodiments of the present invention relate to a semiconductor device, and more particularly, to a fuse layout structure of a semiconductor device.

Fuses are widely used in a semiconductor device for repairing defective memory cells. The defective memory cells included in a main cell are replaced with corresponding redundancy cells by cutting fuses of a redundancy decoder that correspond to an address of the main cell. As the degree of integration of the semiconductor device increases, the semiconductor requires a greater number of the redundancy cells and fuses for repairing the defective memory cells. Accordingly, the width of the fuses becomes narrow and the distance between each fuse decreases. Thus, the fabrication of the semiconductor device needs to be performed with more precision.

FIG. 1 is a diagram illustrating a general fuse structure for use in the semiconductor device.

The fuse F includes two wires M1 and M2 formed in different layers from each other and a contact M2C connecting the two wires M1 and M2.

FIGS. 2 and 3 are plane view figures illustrating a conventional fuse layout of the semiconductor device.

The fuse set shown in FIG. 2 includes two fuses F1 and F2. Each of the fuses F1 and F2 includes two wires formed in different layers and a contact connecting the wires. For example, the first fuse F1 is formed with a first wire M1-F1, a second wire M2-F1, and a contact M2C-F1 connecting the first and second wires M1-F1 and M2-F1. In the same way, second fuse F2 is formed with a first wire M1-F2, a second wire M2-F2, and a contact M2C-F2 connecting the first and second wires M1-F2 and M2-F2. The two fuses F1 and F2 are disposed with a predetermined space interval A. Herein, the wires of the fuses shown in FIG. 2 are formed in a straight line, and only the second wires M2-F1 and M2-F2 are formed in a fuse open area FOA cut by the laser beam.

The fuse set shown in FIG. 3 includes eight fuses F1 to F8. When eight fuses are included in the fuse set, the length of the major axis L1 of the fuse set becomes '7A+W.' Herein, the 'A' denotes a minimum space interval between two neighboring fuses, and 'W' denotes a width of each fuse. Each of the fuses F1 to F8 includes two straight wires formed in different layers and a contact connecting the wires. The second wires M2-F1 to M2-F8 are formed in a fuse open area FOA cut by the laser beam.

Due to the development of the fabrication method of the semiconductor device, it is possible to reduce the width and the size of patterns arranged in the semiconductor device. However, it is relatively difficult to reduce the size of the fuse and the space interval between the fuses because a minimum margin for a fuse cutting operation is hard to decrease. Therefore, the area occupied by the fuse set in the semiconductor device relatively increases as the integration of the semiconductor device increases. Thus, to obtain high integration of the semiconductor device, it is necessary to increase the degree of the integration of fuses.

SUMMARY OF THE INVENTION

An embodiment of the present invention is directed to a fuse layout structure of a semiconductor device with a greater number of fuses included in a predetermined area.

In accordance with an embodiment of the present invention, a fuse layout structure of a semiconductor device includes a plurality of fuses in a fuse open area, wherein three neighboring fuses of the plurality of fuses form a fuse unit, and at least one of the fuses partially overlaps at least one of the other fuses of the same fuse unit in the fuse open area.

In accordance with another embodiment of the present invention, a fuse layout structure of a semiconductor device comprising a plurality of fuses in a fuse open area, each of the fuses includes a first wire and a second wire, wherein the second wires of two neighboring fuses are not overlapped each other in a horizontal direction as well as a vertical direction.

DESCRIPTION OF SPECIFIC EMBODIMENTS

Figure 1:
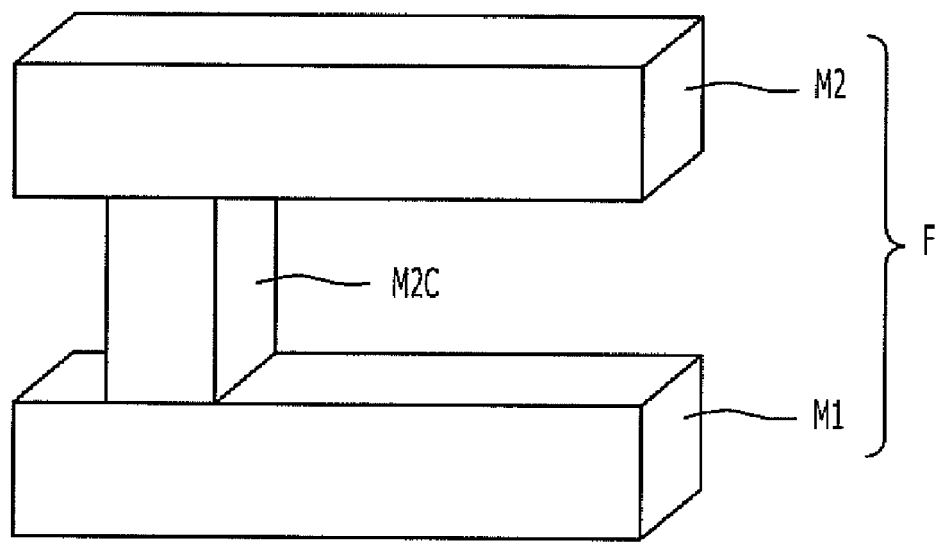
FIG. 1 is a diagram illustrating a general fuse structure for use in the semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
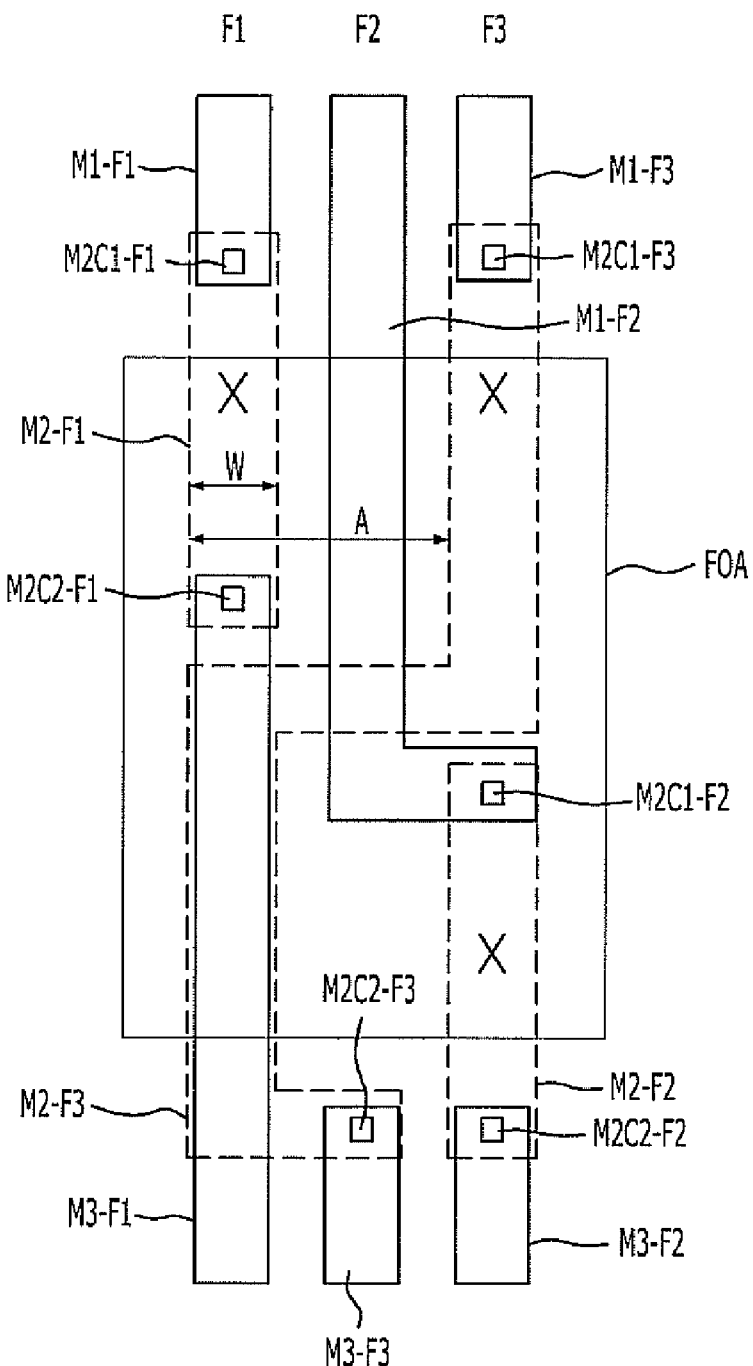
FIGS. 4 and 5 are plane view figures illustrating fuse layouts of the semiconductor memory device in accordance with an embodiment of the present invention.
Figure 5:
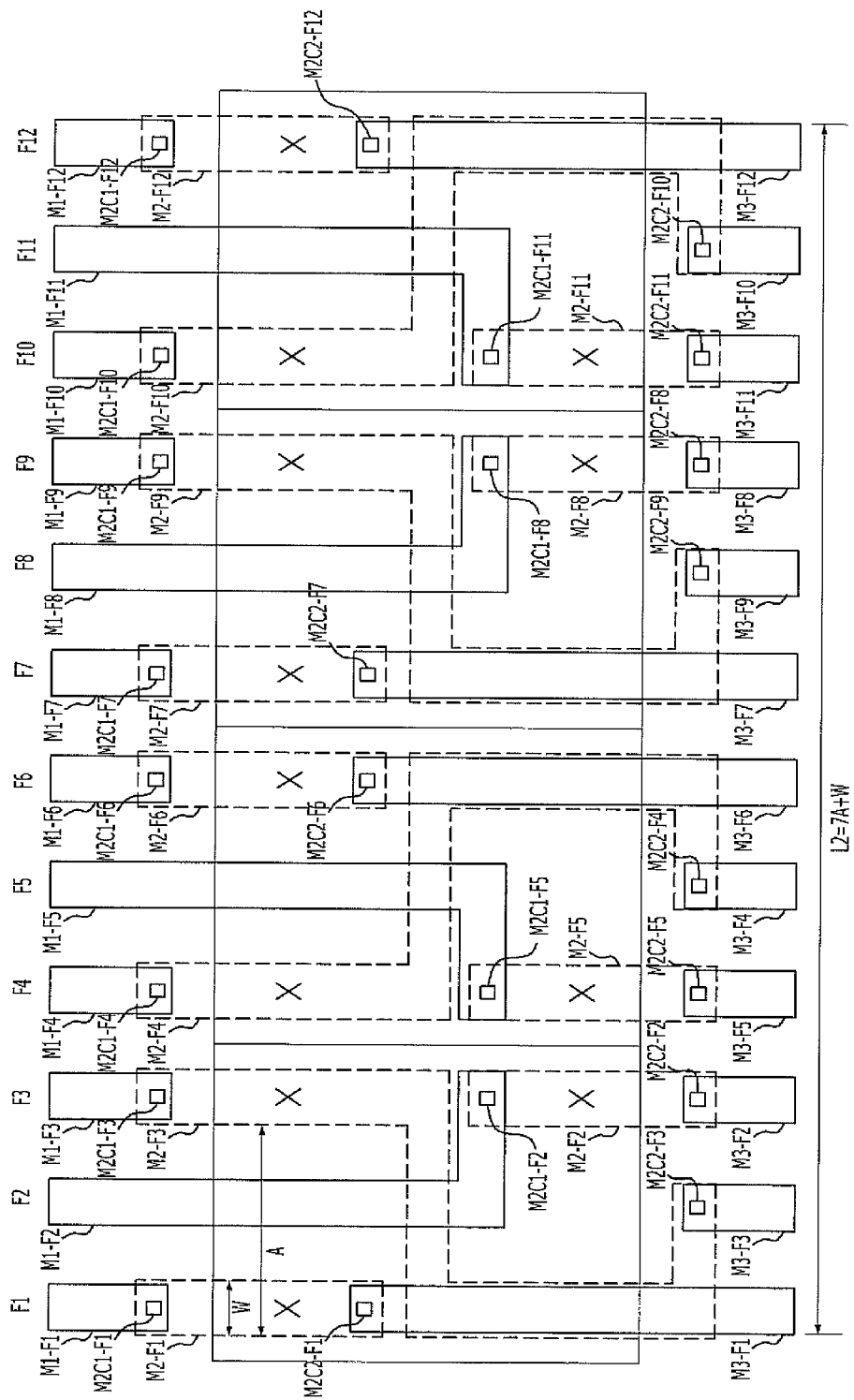

FIGS. 4 and 5 are plane view figures illustrating fuse layouts of the semiconductor memory device in accordance with an embodiment of the present invention.

As shown in FIGS. 4 and 5, three fuses form a fuse unit and the fuses of each fuse unit partially overlap one another inside of a fuse open area FOA.

The fuse set shown in FIG. 4 includes three fuses F1 to F3. Each of the fuses includes three wires and two contacts. The first and third wires are formed in the same layer and the second wire is formed in a different layer than the first and third wires. The first and third wires formed in the same layer are described as separate wires for convenience of explanation, but can be considered as a single wire. Usually, the second wire is formed in an upper layer and the first and the third wires are formed in a lower layer. The first contact connects the first and second wires, and the second contact connects the second and third wires. The three wires and the two contacts are formed with a conductive material selected from Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Jr, Ta, Hf, K, Li, Cs, and alloys thereof.

The three wires M1-F1 to M3-F1 of the first fuse F1 are formed in a straight line. A partial portion of the third wire M3-F1 of the first fuse F1 is formed inside of the fuse open area FOA. Therefore, the second contact M2C2-F1 of first fuse F1 is formed inside of the fuse open area FOA. The first wire M1-F2 of the second fuse F2 is formed to have a curved shape. The degree of the curve of the first wire M1-F2 is not specifically designated, but is usually set to 45° or 90° for the purposes of convenient fabrication. The second and third wires M2-F2 and M3-F2 of the second fuse F2 are formed in a straight line. A partial portion of the first wire M1-F2 of the second fuse F2 is formed inside of the fuse open area FOA. Therefore, the first contact M2C1-F2 of the second fuse F2 is formed inside of the fuse open area FOA. The first and third wires M1-F3 and M3-F3 of the third fuse F3 are formed in a straight line. The second wire M2-F3 of the third fuse F3 has at least one curve and does not overlap the second wires M2-F1 and M2-F2 of the first and second fuses F1 and F2. The length of the second wire M2-F3 is longer than that of the second wires M2-F1 and M2-F2. Both of the first and second contacts M2C1-F3 and M2C2-F3 are formed outside of the fuse open area FOA.

The areas denoted with 'X' in FIG. 4 are second wires cut by a laser beam. Further, the second wires formed in those areas do not overlap with the first wires. In other words, there are only second wires in the areas denoted with 'X'.

Figure 2:
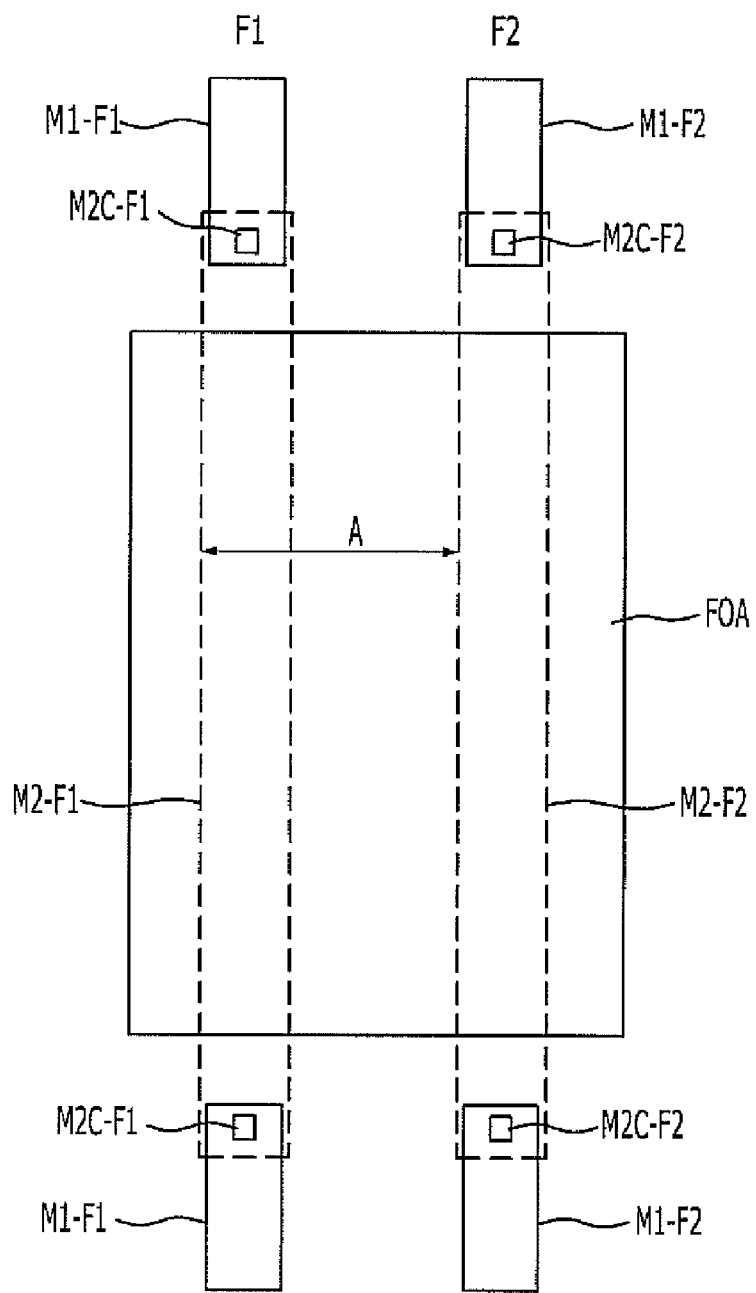
FIGS. 2 and 3 are plane view figures illustrating conventional fuse layouts of the semiconductor device.

In comparison to the fuse set shown in FIG. 2, the fuse set of FIG. 4 includes one more fuse. That is, the fuse set of FIG. 2 includes two fuses F1 and F2 in a predetermined area while the fuse set of FIG. 4 includes three fuses F1 to F3 in an equal predetermined area. This is possible by overlapping the wires which are formed in different layers. For example, the partial portion of the third wire M3-F1 of the first fuse F1 overlaps with the partial portion of the second wire M2-F3 of the third fuse F3. Further, the partial portion of the first wire M1-F2 of the second fuse F2 overlaps with the partial portion of the second wire M2-F3 of the third fuse F3.

The fuse set shown in FIG. 5 shows four fuse units, each of which includes three fuses. The first and third fuse units have an equivalent structure as the fuse set shown in FIG. 4. Meanwhile, the second and fourth fuse units have structures that mirror the first and third fuse units (e.g., mirror the other fuse units with respect to a common axis in-between). That is, neighboring fuse units have structures that mirror one another.

In detail, the first fuse unit constituted with first to third fuses F1 to F3 has the equivalent structure with the fuse set shown in FIG. 4. The second fuse unit containing fourth to sixth fuses F4 to F6 has a structure that mirrors the first fuse unit. That is, the fourth fuse F4 neighboring the third fuse F3 has a structure that mirrors the structure of the third fuse F3. Further, the fifth fuse F5 and sixth fuse F6 have structures that mirror the structures of the second fuse F2 and the first fuse F1, respectively.

For example, the fourth fuse F4 includes first and third wires M1-F4 and M3-F4 that are formed in a straight line, and a second wire M2-F4 having at least one curve. The degree of the curve of the second wire M2-F4 of the fourth fuse F4 is not specifically designated, but is usually selected to be 45° or 90° for the purposes of convenient fabrication. Both a first and second contact M2C1-F4 and M2C2-F4 of the fourth fuse F4 are formed outside of the fuse open area FOA. The second and third wires M2-F5 and M3-F5 of the fifth fuse F5 are formed in a straight line. A partial portion of the first wire M1-F5 of the fifth fuse F5 is formed inside of the fuse open area FOA. Therefore, the first contact M2C1-F5 of the fifth fuse F5 is formed inside of the fuse open area FOA. The three wires M1-F6 to M3-F6 of the sixth fuse F6 are formed in a straight line. A partial portion of the third wire M3-F6 of the sixth fuse F6 is formed inside of the fuse open area FOA. Therefore, the second contact M2C2-F6 of the sixth fuse F6 is formed inside of the fuse open area FOA.

Hereinafter, the embodiment of the present invention shown in FIG. 5 is compared with the conventional fuse set of the semiconductor device shown in FIG. 3 with regards to size.

Figure 3:
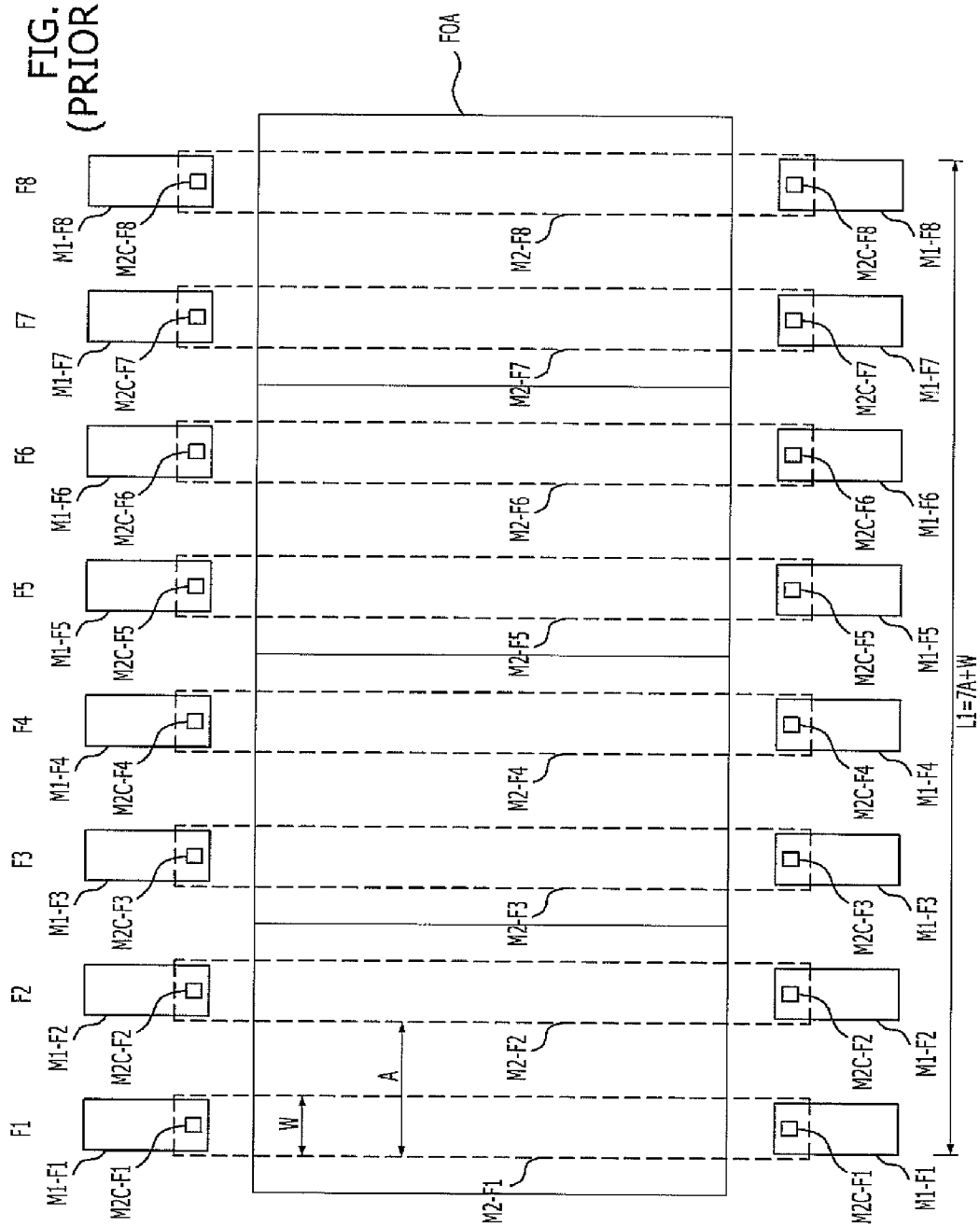

The length of the major axis L2 of the fuse set shown in FIG. 5 is equivalent with that of the conventional fuse set shown in FIG. 3 (i.e., L2 is also '7A+W'). However, the fuse set of FIG. 5 includes twelve fuses F1 to F12 within the length of '7A+W,' while the fuse set of FIG. 3 includes eight fuses F1 to F8 within the same length. That is, the fuse set of FIG. 5 includes four more fuses than the fuse set of FIG. 3. Therefore, the present invention increases the number of fuses included in a predetermined area by 1.5 times more than the conventional art.

As mentioned above, the embodiment of the present invention includes a plurality of fuses in a fuse open area, wherein the neighboring three fuses of the plurality of fuses form a fuse unit. By partially overlapping the fuses included in the same fuse unit, the present invention increases the number of fuses included in a predetermined area.

Figure 6:
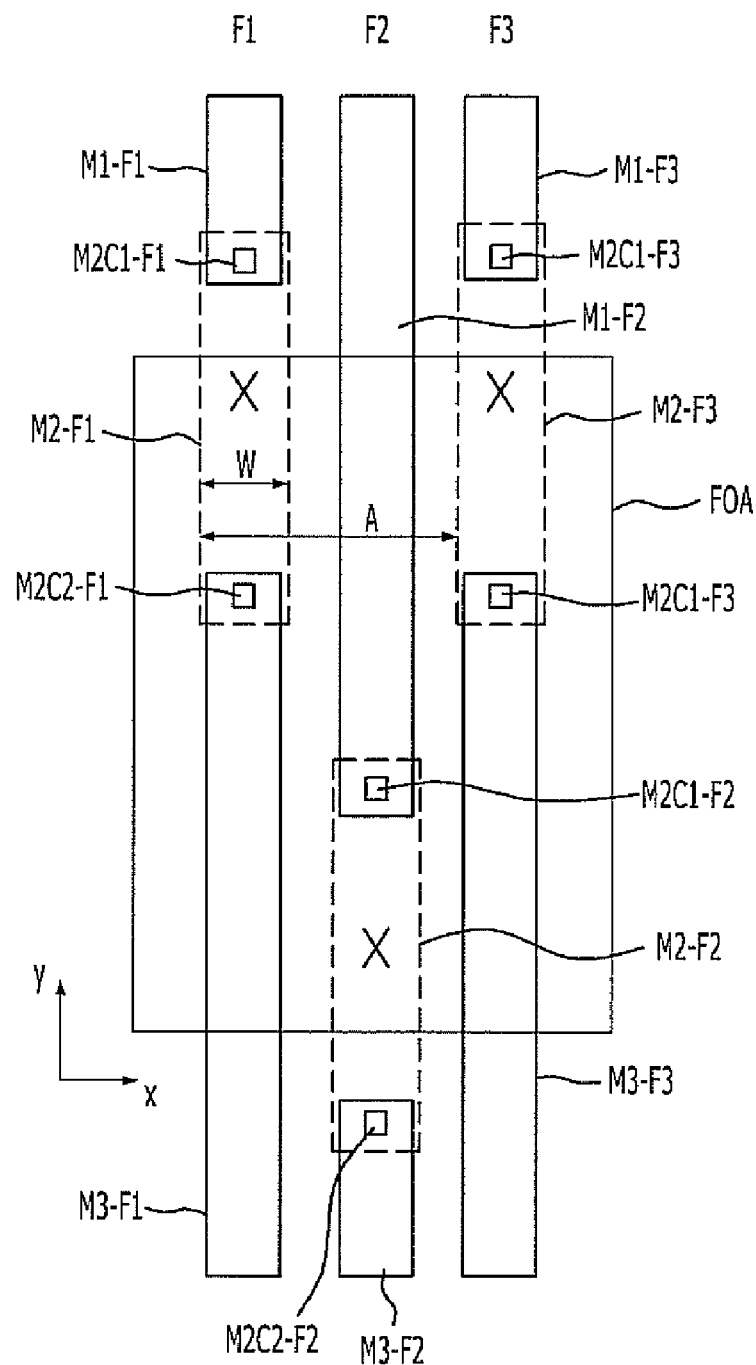
FIG. 6 is a plane view figure illustrating fuse layout of the semiconductor memory device in accordance with another embodiment of the present invention.

FIG. 6 is a plane view figure illustrating fuse layout of the semiconductor memory device in accordance with another embodiment of the present invention.

The fuse set shown in FIG. 6 includes three fuses F1 to F3. Each of the fuses includes three wires and two contacts. The first and third wires are formed in the same layer and the second wire is formed in a different layer than the first and third wires. The first and third wires formed in the same layer are described as separate wires for convenience of explanation, but can be considered as a single wire. Usually, the second wire is formed in an upper layer and the first and the third wires are formed in a lower layer. The first contact connects the first and second wires, and the second contact connects the second and third wires. The three wires and the two contacts are formed with a conductive material selected from Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs, and alloys thereof.

All wires M1-F1 to M3-F3 of the fuses F1 to F3 shown in FIG. 6 are formed in a straight line. The second wires of two neighboring fuses are not overlapped in a 'y' direction as well as a 'x' direction. For example, a partial portion of the third wire M3-F1 of the first fuse F1 is formed inside of the fuse open area FOA so that the second contact M2C2-F1 of first fuse F1 is formed inside of the fuse open area FOA. A partial portion of the first wire M1-F2 of the second fuse F2 is formed inside of the fuse open area FDA so that the first contact M2C1-F2 of second fuse F2 is formed inside of the fuse open area FOA. Herein, the second contact M2C2-F1 of first fuse F1 and the first contact M2C1-F2 of second fuse F2 are not crossed each other so that the second wires M2-F1 and M2-F2 of the first and second fuses F1 and F2 are not overlapped each other in 'y' direction. The third fuse F3 is also formed in the equivalent form with the first fuse F1 and, therefore, the second wires M2-F2 and M2-F3 of the second and third fuses F2 and F3 are not overlapped each other in the 'y' direction as well as the 'x' direction. Accordingly, the second wires M2-F1 and M2-F3 of the first and the third fuses F1 and F3 are formed with the minimum space interval 'A' and it is possible to obtain a minimum margin for a fuse cutting operation.

In comparison to the fuse set shown in FIG. 2, the fuse set of FIG. 6 includes one more fuse. That is, while the fuse set of FIG. 2 includes two fuses F1 and F2 in a predetermined area, the fuse set of FIG. 6 includes three fuses F1 to F3 in an equal predetermined area. This is possible by decreasing the length of the second wires and arranging the second wires of two neighboring fuses not being overlapped each other in the 'y' direction as well as the 'x' direction. In addition, the areas denoted with 'X' are portions of the second wires cut by a laser beam.

As mentioned above, the embodiment of the present invention increases the number of fuses included in a predetermined area by decreasing the length of the second wires and arranging the second wires of two neighboring fuses not being overlapped each other in the 'y' direction as well as the 'x' direction.

While the present invention has been described with respect to the specific embodiments, it will be apparent to those skilled in the art that various changes and modifications may be made without departing from the spirit and scope of the invention as defined in the following claims.

What is claimed is:

1. A fuse layout structure of a semiconductor device comprising a plurality of fuses in a fuse open area, wherein three neighboring fuses of the plurality of fuses form a fuse unit, and at least one of the fuses partially overlaps at least one of the other fuses of the same fuse unit in the fuse open area,
   wherein each of the fuse units include first, second, and third fuses, and each of the first, second, and third fuses includes:
   a first wire;
   a second wire formed above the first wire; and
   a contact connecting the first wire and the second wire,
   wherein the second wires of the first and second fuses are each formed in a straight line, and the second wire of the third fuse has at least one curve.

2. The fuse layout structure of claim 1, wherein the second wire is cut by a laser beam.

3. The fuse layout structure of claim 1, wherein two neighboring fuse units together have a symmetrical structure.

4. The fuse layout structure of claim 1 wherein a length of the second wire of the third fuse is longer than a length of the second wire of both the first fuse and the second fuse.

5. The fuse layout structure of claim 1 wherein the first wire of the second fuse and the second wire of the third fuse partially overlap.

6. The fuse layout structure of claim 1, wherein the first wire of the second fuse has at least one curve.

7. The fuse layout structure of claim 1, wherein the second wire of the first fuse and the first wire of the second fuse partially overlap.

8. The fuse layout structure of claim 1, wherein a length of the second wire of the first fuse is longer than a length of the second wire of both the second fuse and the third fuse.

9. The fuse layout structure of claim 1, wherein the first and second wires and the contact are formed with a conductive material selected from Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs, and alloys thereof.

* * * * *